(12) United States Patent
Park

(10) Patent No.: US 7,491,557 B2
(45) Date of Patent: Feb. 17, 2009

(54) THIN FILM ETCHING METHOD AND METHOD OF FABRICATING LIQUID CRYSTAL DISPLAY DEVICE USING THE SAME

(75) Inventor: Jeong Kweon Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 465 days.

(21) Appl. No.: 11/246,077

(22) Filed: Oct. 11, 2005

(65) Prior Publication Data

US 2006/0099747 A1 May 11, 2006

(30) Foreign Application Priority Data

Nov. 5, 2004 (KR) .......................... 10-2004-89705

(51) Int. Cl.
*H01L 21/00* (2006.01)
(52) U.S. Cl. ..................... 438/29; 438/30; 438/149; 257/E21.416
(58) Field of Classification Search .................. 438/30, 438/149, 29, 158, 70
See application file for complete search history.

(56) References Cited

U.S. PATENT DOCUMENTS

| | | | |
|---|---|---|---|
| 6,127,068 A * | 10/2000 | Shoki et al. | 430/5 |
| 6,549,608 B1 * | 4/2003 | Mamine et al. | 378/34 |
| 6,555,781 B2 | 4/2003 | Ngoi et al. | |
| 2003/0090603 A1 | 5/2003 | Chae et al. | |
| 2003/0150384 A1 | 8/2003 | Baude et al. | |
| 2003/0179338 A1 * | 9/2003 | Kim | 349/153 |

FOREIGN PATENT DOCUMENTS

CN 1257304 A 6/2000

OTHER PUBLICATIONS

Y. Nakata, T. Okada, M. Maeda: "Micromachining of a thin film by laser ablation using femtosecond laser with masks", Optics&Laser Engineer, (2004) 389-93.
C. K. Malek, K.H. Jackson, W.D. Bonivert, J. Hruby: "Masks for high aspect ratio x-ray lithography", J. Micromech. Microeng 6(1996) pp. 228-235.
Sun Xiaohui et al.; "The Latest Development of Femtosecond Laser Processing"; (Development of Laser and Optoelectronics); vol. 41, No. 9, Sep. 2004; pp. 37-45.
Yang, Jianjun, Femtosecond Laser "Cold" Micro-Machining and Its Advanced Applications, School of Engineering and Technology, vol. 41, No. 3, (Mar. 2004), pp. 42-45, 57.

* cited by examiner

*Primary Examiner*—Michael Trinh
(74) *Attorney, Agent, or Firm*—McKenna Long & Aldridge LLP

(57) ABSTRACT

A thin film etching method includes forming a layer on a substrate, aligning a mask having a pattern defined thereon above the layer, and removing a portion of the layer by irradiating the substrate with a femtosecond laser through the mask.

9 Claims, 10 Drawing Sheets

THIN FILM ETCHING METHOD AND METHOD OF FABRICATING LIQUID CRYSTAL DISPLAY DEVICE USING THE SAME

The present invention claims the benefit of Korean Patent Application No. P2004-0089705 filed in Korea on Nov. 5, 2004, which is hereby incorporated by reference.

BACKGROUND OF THE INVENTION

1. Field of the Invention

The present invention relates to a liquid crystal display device and, more particularly, a thin film etching method and a method of fabricating a liquid crystal display device using the same. Although the present invention is suitable for a wide scope of applications, it is particularly suitable for process simplification and manufacturing cost reduction of thin films.

2. Discussion of the Related Art

As the information-oriented society is developing, the demands for display devices gradually rise. Many efforts have been made to research and develop various flat panel display devices, such as liquid crystal display (LCD) devices, plasma display panel (PDP) devices, electroluminescent display (ELD) devices and vacuum fluorescent display (VFD). Among the various types of flat display devices, LCD devices have been most widely used as a substitute for a cathode ray tube (CRT) devices due their advantageous characteristics of thin profile, light weight, and low power consumption. For example, LCD devices have been used in car-mounted monitors, color televisions, laptop computers and pocket computers.

To make LCD devices usable in various fields as a general display device, LCD devices need to implement an image of high quality including high definition, high luminance, wide area and the like while maintaining the characteristics of lightweight, slim size and low power consumption. In general, an LCD device includes a liquid crystal display panel displaying an image thereon and a drive unit for applying a drive signal to the liquid crystal display panel. The liquid crystal display panel includes a first glass substrate, a second glass substrate, and a liquid crystal layer between the first and second glass substrates.

The first glass substrate, which is often referred to as a TFT array substrate, includes a plurality of gate lines arranged in one direction, a plurality of data lines arranged in a direction perpendicular to the gate lines, a plurality of pixel electrodes arranged in a matrix form on a plurality of pixel areas defined by crossings between the gate and data lines, and a plurality of thin film transistors in the pixel areas to selectively deliver signals of the data lines to the pixel electrodes. The second glass substrate, which is often referred to as a color filter substrate, includes a black matrix layer to block light from an area excluding the pixel areas, an R/G/B color filter layer to represent colors, and a common electrode to implement an image.

The first and second glass substrates are bonded together by a sealant with a space therebetween maintained by spacers. A liquid crystal inlet is initially formed in the sealant, such that a liquid crystal material is injected between the bonded first and second glass substrates through the liquid crystal inlet. For example, by submerging the liquid crystal inlet in a container holding the liquid crystal material under a vacuum state, the liquid crystal material is injected between the bonded first and second glass substrates by osmosis. After the liquid crystal material is injected, the liquid crystal inlet is then sealed.

In a general fabricating process of an integrated circuit, transistor, LCD, diode and the like, a photolithography process for forming a micro pattern and an etching process through the micro pattern are used to form a thin film pattern. The photolithography process includes coating a resist material, exposure the coated resist material through a photomask and development of the exposed resist material to form the micro pattern.

FIGS. 1A to 1C are cross-sectional views illustrating a thin film etching method according to the related art. An object etching method and a liquid crystal display device fabricating method using the same according to the related art are explained with reference to the attached drawings as follows. Referring to FIG. 1A, a substrate 1 includes an insulating layer 2, a metal layer 3, and a photoresist layer 4 sequentially formed thereon. The photoresist layer 4 can be formed by one of spin coating process, spray coating process, and deep coating process. In particular, spin coating by rotating a substrate, which is held by a chuck, at high speed in a vacuum state is commonly used due to its good stability and uniformity. In addition, a photomask 5 having a specific pattern shape is placed over the substrate 1 having the photoresist layer 4. Then, UV-rays (shown as arrows) are irradiated the substrate 1 through the photomask 5 for exposure.

Referring to FIG. 1B, the exposure-treated photoresist layer 4 (shown in FIG. 1A) is developed into a photoresist pattern 4a corresponding to the specific pattern shape of the photomask 5. In developing the exposure-treated photoresist layer 4, deposition or spray is used. In the deposition development method, it is difficult to manage temperature, concentration, aging effect and the like. In comparison, the spray development method is more advantageous in managing temperature, concentration, aging effect and the like. Thus, in general, an in-line instrument employing the spray development method is used. Subsequently, the metal layer 3 (shown in FIG. 1A) is selectively removed by a dry or wet etching process using the photoresist pattern 4a as an etch mask to form a metal line 3a.

Referring to FIG. 1C, the photoresist pattern 4a (shown in FIG. 1B) used as the etch mask in forming the metal line 3a is removed. The photoresist pattern 4a can be removed by using $O_2$ plasma or various oxidizers. For example, in the $O_2$ plasma method, $O_2$ gas is injected with a high voltage in a vacuum state to generate $O_2$ plasma, such that the $O_2$ plasma reacts with a photoresist to dissolve and remove the photoresist. However, such a method needs expensive equipment to generate the $O_2$ plasma, and rotational particles in the $O_2$ plasma cause undesired damage to a substrate. In the method using oxidizers, thermal concentric sulfuric acid or a mixed solution of thermal concentric sulfuric acid and hydro peroxide is used as an oxidizer. Thus, in fabricating a liquid crystal display device, coating, exposure and development processes are repeatedly carried out to form various photoresist patterns as etching masks, and the process of removing the photoresist patterns is repeated as well. Thus, the fabrication process is time consuming and expensive.

FIGS. 2A to 2F are cross-sectional views illustrating a method of fabricating a liquid crystal display device according to the related art. Referring to FIG. 2A, a metal layer is formed on a transparent first substrate 11 and a first photoresist layer (not shown) is coated on the deposited metal layer. Exposure and development processes are carried out on the first photoresist to selectively form a first photoresist pattern. Subsequently, the metal layer is selectively removed using the first photoresist pattern as a first etch mask to form a gate electrode 12 and a gate line (not shown) extending from the gate electrode 12 in a first direction. Then, the first photoresist pattern is removed.

An insulating material, such as silicon nitride or silicon oxide, is deposited on the first substrate 11 including the gate electrode 12 to form a gate insulating layer 13. An amorphous silicon layer and a doped amorphous silicon layer are sequentially formed on the gate insulating layer 13. After a second photoresist layer has been coated on the doped amorphous silicon layer, the second photoresist layer is patterned by exposure and development processes to form a second photoresist pattern. Subsequently, the doped amorphous silicon layer and the amorphous silicon layer are selectively removed using the second photoresist pattern as a second etch mask to form an active layer 14 and an ohmic contact layer 15. Then, the second photoresist pattern is removed.

Referring to FIG. 2B, a second metal layer is formed on the first substrate 11, a third photoresist layer is coated on the second metal layer, and a third photoresist pattern is then formed by patterning the third photoresist layer using exposure and development processes. The second metal layer is selectively removed using the third photoresist pattern as a third etch mask to form a source electrode 16a and a drain electrode 16b at lateral ends on the active layer 14. Although not shown, the source electrode 16a extends from a data line, which vertically crosses the gate line, to thereby define a pixel area. In particular, the source and rain electrodes 16a and 16b are spaced apart from each other to form a channel in a later process. Thus, a portion of the ohmic contact layer 15 is exposed between the source and drain electrodes 16a and 16b. The source and drain electrodes 16a and 16b together with the gate electrode 12 form a thin film transistor T. Then, the third photoresist pattern is removed.

Referring to FIG. 2C, a silicon oxide, silicon nitride or organic insulating layer is formed on the source and drain electrodes 16a and 16b to form a protecting layer 17. When forming the protecting layer 17 with the organic insulating layer, no step difference is created by the thin film transistor T because the organic insulating layer can be formed to be planar. In addition, a fourth photoresist layer is coated on the protecting layer 17 and is then patterned by exposure and development processes to form a fourth photoresist pattern. A contact hole 18 is formed by selectively removing a portion of the protecting layer 17 to expose a predetermined surface of the drain electrode 16b using the fourth photoresist pattern as a fourth etch mask. Then, the fourth photoresist pattern is removed.

Referring to FIG. 2D, a transparent metal layer, such as an ITO layer, is formed on the first substrate 11 including the contact hole 18. A fifth photoresist layer is coated on the transparent metal layer and is then patterned by exposure and development processes to form a fifth photoresist pattern. Subsequently, a portion of the transparent metal layer is selectively removed using the fifth photoresist pattern as a fifth etch mask to form a pixel electrode 19 electrically connected to the drain electrode 16b via the contact hole 18. Then, the fifth photoresist pattern is removed.

Referring to FIG. 2E, a first alignment layer 20 is formed over the first substrate 11 including the pixel electrode 19. The first alignment layer 20 is formed by coating a polymer film and aligning the polymer film by a rubbing process. A polyimide-based organic substance is generally used as the alignment layer. The rubbing process, which includes the step of rubbing the alignment layer in a predetermined direction using a rubbing cloth, is suitable for mass production and provides a stable pretilt angle alignment. Recently, a photo alignment method using a polarized light is developed and used.

Referring to FIG. 2F, a second substrate 31 facing the first substrate 11. The second substrate 31 includes a black matrix 32. The black matrix 32 is a Cr layer or the like to prevent light leakage through areas of the second substrate 31 except for the pixel areas. The black matrix 32 is formed by a photolithography process. In addition, a color filter 33 is formed on the second substrate 31 between gaps of the black matrix 32. The color filter 33 includes red, green and blue sub-color filters, and each of the sub-colors corresponds to one pixel area.

A common electrode 34 is formed on the second substrate 31 including the color filter 33. Further, a second alignment layer 35 is formed of a material, such as polyimide and the like, on the common electrode 34 such that a surface of the second alignment layer 35 is oriented in a predetermined direction.

A seal pattern (not shown) is formed on one the first substrate 11 and the second substrate 31. The seal pattern is located at a periphery of a display area, includes a gap for liquid crystal injection and prevents leakage of the injected liquid crystals. The seal pattern is formed using a thermo-hardening resin by a screen print method using a screen mask or a seal dispenser method using a dispenser.

To simplify the process, the screen print method is widely used. However, it is difficult for using the screen mask with a large-sized substrate. In addition, the screen print method induces failure due to the contact between the mask and the alignment layer. Thus, the screen print method tends to be replaced by the seal dispenser method.

To keep the uniform gap between the first and second substrates 11 and 31, spacers (not shown) are scattered on one the first substrate 11 and the second substrate 31. The spacers are scattered by wet scattering of a mixture of spacers and alcohol and the like or dry scattering of spacers only. Dry scattering is divided into electrostatic scattering using static electricity and non-electric scattering using a gas pressure. Since the liquid crystal display device is vulnerable to static electricity, non-electric scattering is widely used.

Subsequently, the first and second substrates 11 and 31 are loaded in a bonding chamber and are bonded to each other by pressurizing and hardening the seal pattern. As a result, the first substrate 11 and the second substrate 31 are arranged with the first and second alignment layers 20 and 35 facing each other and the pixel electrode 19 facing the color filter 33 in one-to-one manner.

After the first and second substrates 11 and 31 are bonded to each other, a liquid crystal material is injected between the bonded first and second substrates 11 and 31 via the gap in the seal pattern to form a liquid crystal layer 40. The liquid crystal injection is carried out by vacuum injection using a difference between inner and outer pressures of the LCD panel. When the liquid crystal molecules are injected in the LCD panel, air amongst the liquid crystal molecules creates bubbles within the LCD panel that cause device failure. To prevent the bubble generation, a process of removing the bubbles by leaving the liquid crystal molecules in a vacuum state for a considerable time is needed. After completion of the liquid crystal injection, the gap in the seal pattern is sealed to prevent the liquid crystal material from flowing out via the gap.

The related art thin film etching method and method of fabricating a liquid crystal display device using the same have the following problems. First, the photoresist layer has to be formed on the object layer to be etched, such as an insulating layer, a semiconductor layer or a metal layer. Then, exposure and development processes are carried out to pattern the photoresist layer through a photomask. Subsequently, the object layer can be selectively etching using the patterned photoresist layer as an etch mask. Then, the photoresist is removed. Accordingly, the related art method repeats the above steps, thereby complicating the fabrication process and lowering productivity.

SUMMARY OF THE INVENTION

Accordingly, the present invention is directed to a thin film etching method and a method of fabricating a liquid crystal display device using the same that substantially obviate one or more of the problems due to limitations and disadvantages of the related art.

An object of the present invention is to provide a thin film etching method and a method of fabricating a liquid crystal display device using the same that provide a simplified process and improves process productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film etching method includes forming a layer on a substrate, aligning a mask having a pattern defined thereon above the layer, and removing a portion of the layer by irradiating the substrate with a femtosecond laser through the mask.

In another aspect, a method of fabricating a liquid crystal display device includes forming a first conductive layer on a first substrate, removing a portion of the first conductive layer using a femtosecond laser to form a gate electrode, forming a gate insulating layer on the first substrate including the gate electrode, forming a semiconductor layer on the first substrate including the gate insulating layer, removing a portion of the semiconductor layer using the femtosecond laser to form an active layer, forming a second conductive layer on the first substrate including the active layer, removing a portion of the second conductive layer using the femtosecond laser to form a source electrode and a drain electrode, forming a protecting layer on the first substrate including the source and drain electrodes, removing a portion of the protecting layer to form a contact hole exposing a portion of the source electrode using the femtosecond laser, forming a third conductive layer on the first substrate including the contact hole, and removing a portion of the third conductive layer to form a pixel electrode electrically connected to the drain electrode via the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1A:
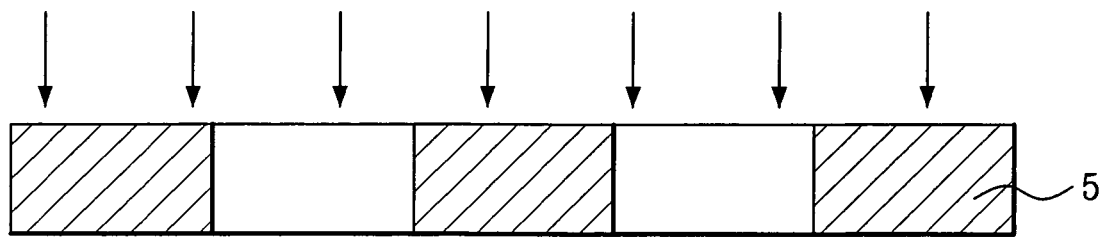
FIGS. 1A to 1C are cross-sectional views illustrating a thin film etching method according to the related art.
Figure 1A:
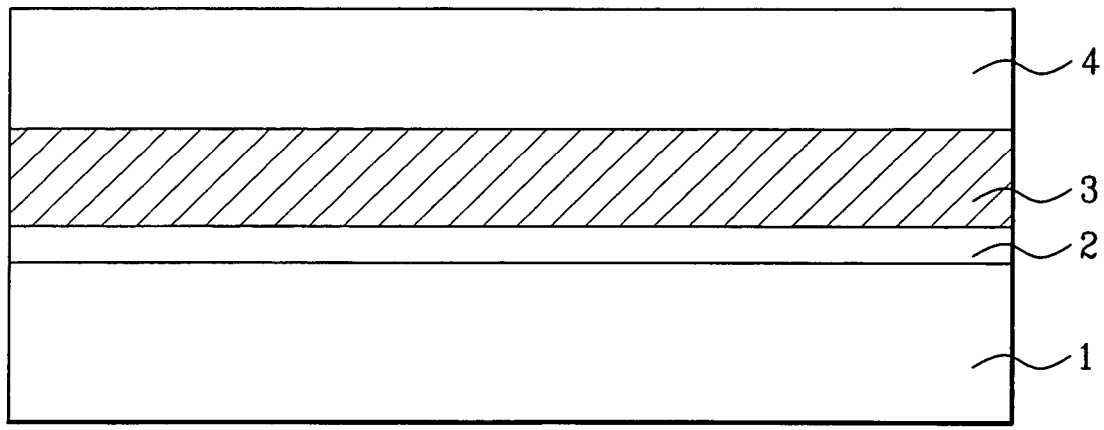
Figure 1B:
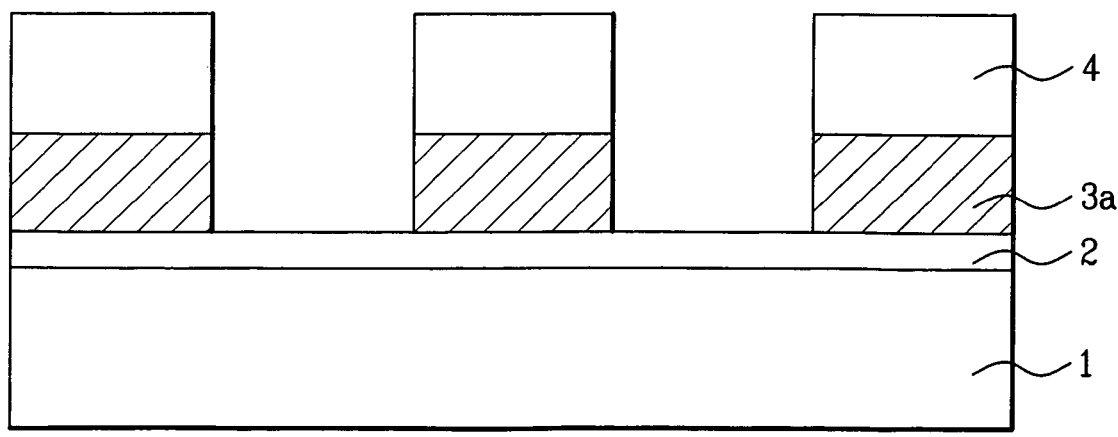
Figure 1C:
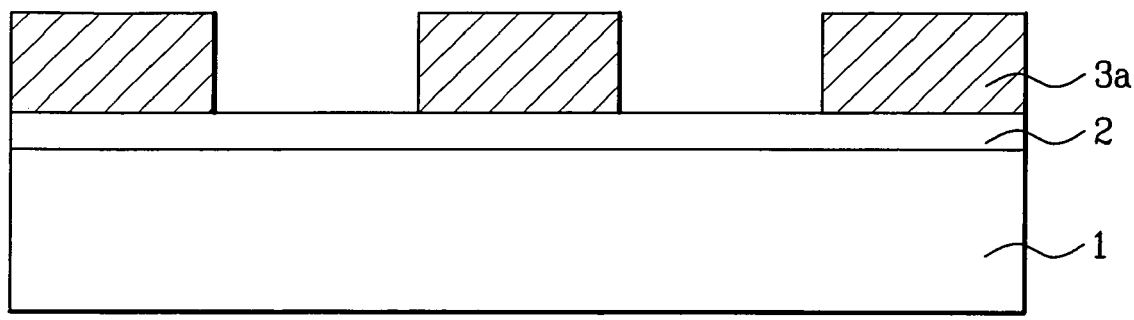
Figure 2A:
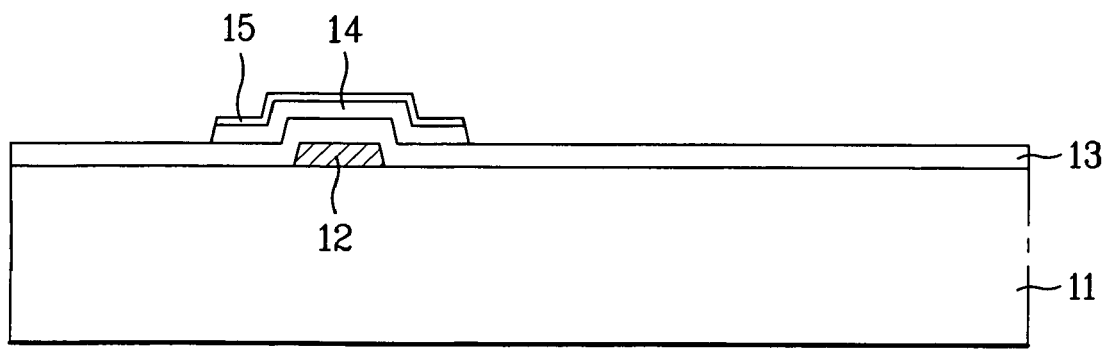
FIGS. 2A to 2F are cross-sectional views illustrating a method of fabricating a liquid crystal display device according to the related art.
Figure 2B:
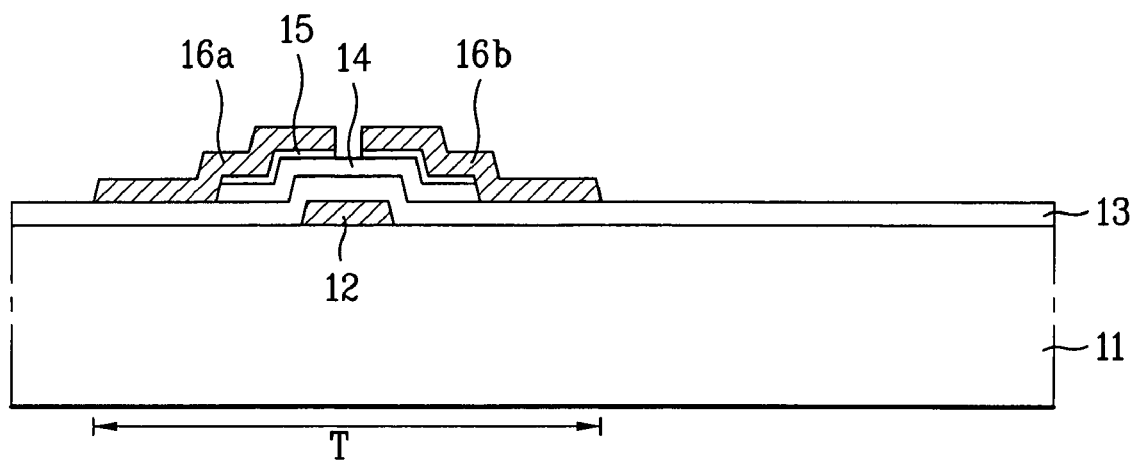
Figure 2C:
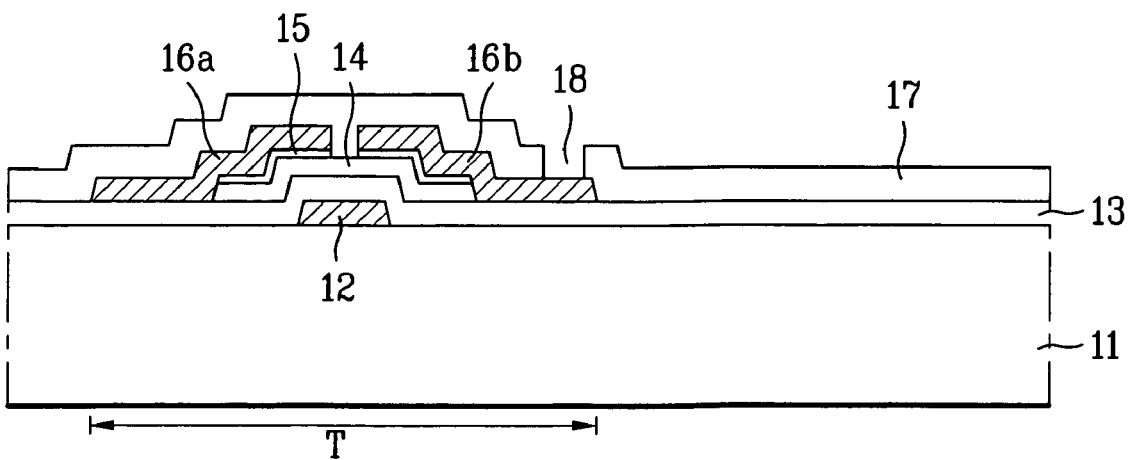
Figure 2D:
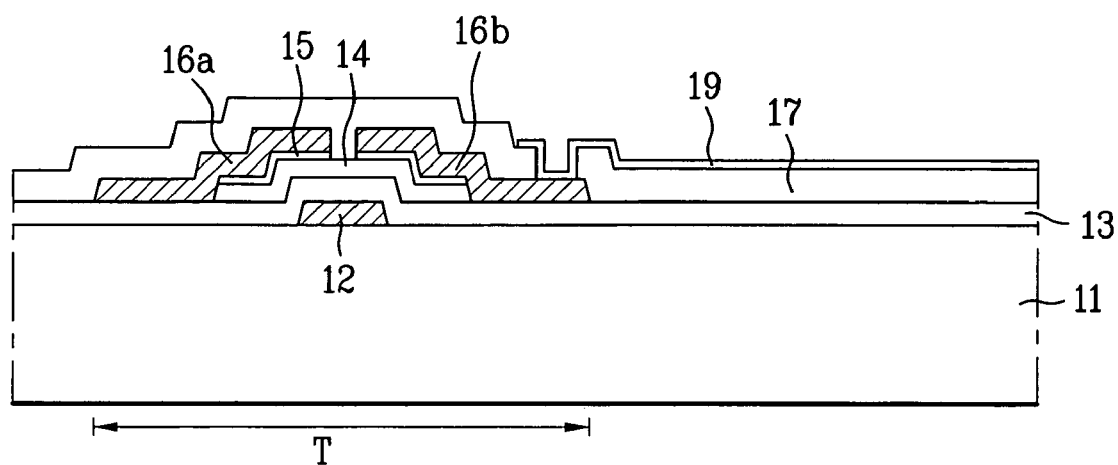
Figure 2E:
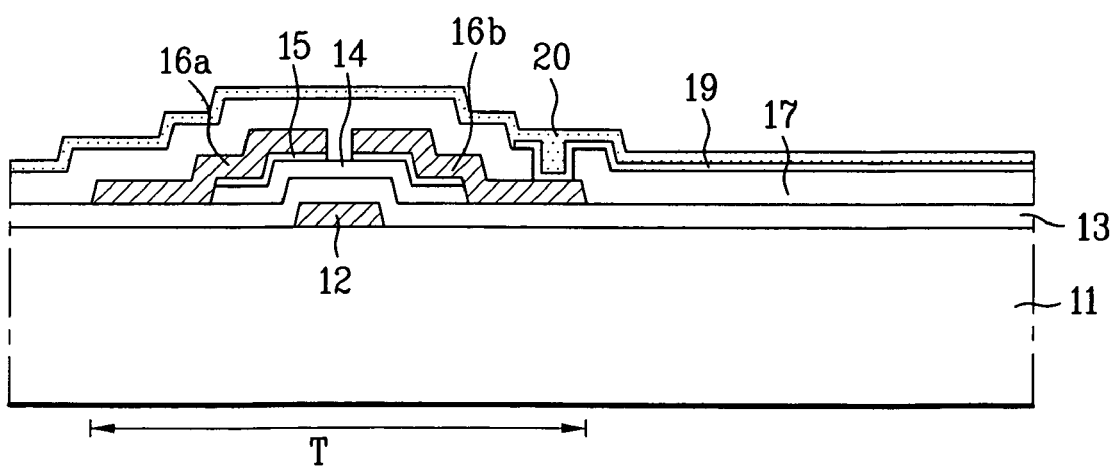
Figure 2F:
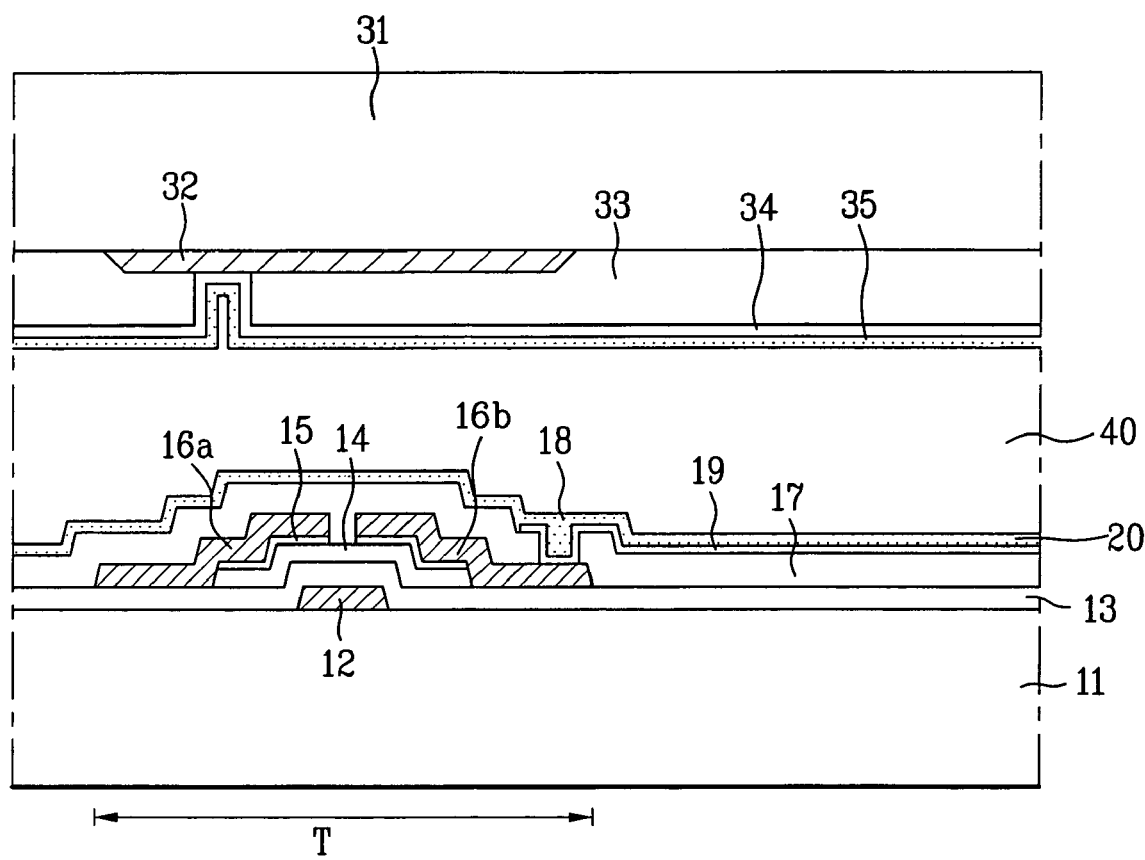

Reference will now be made in detail to the preferred embodiments of the present invention, examples of which are illustrated in the accompanying drawings.

A laser ablation is used in fabricating a high precision and purity part. When using a fast pulse, ablation is advantageous that it causes less thermal damage to the surroundings. For example, a nanosecond laser processing machine is a laser processing machine using an YAG laser or an excimer laser of $10^{-9}$ m/s pulse unit. When the processing machine using an YAG laser, which generates a laser by artificial crystalline particles of aluminum oxide, a processed sidewall becomes coarse. When the processing machine using an IR $CO_2$ laser, a crater is formed at the processed portion. Thus, it is difficult to provide a fine processing requiring a precision below micrometer unit, because in such a laser heat processing, photo energy is converted to thermal energy. As a result, the corresponding processed shape is easily breakable, such that it is difficult to provide the precision processing.

In contrast, when the processing machine using an excimer laser, precision processing is possible due to sublimation etching by photochemical reaction of cutting a covalent bond of carbon atom. This is because ablative photodecomposition processing is performed for endothermic evaporation processing, such that a surface of an object, on which the excimer laser is irradiated, is dispersed and decomposed by the plasma irradiation and impact noise. However, energy of the excimer laser is not entirely used in cutting the covalent bonds of atoms but is transformed into thermal energy in part. Since the corresponding energy density is very high, its thermal influence is considerable. Thus, it is difficult to process minerals having high thermal conductivity such as metal, ceramic and silicon and quartz or glass having low photo absorption. In addition, despite thermal energy lower than the former, thermal transformation can affect endurance of a processed product.

On the other hand, a femtosecond laser having a pulse irradiation time of $10^{-15}$ m/s is found to solve the above-mentioned problems. This is because an oscillation density of laser energy is very high when using a laser oscillating during an ultra-short pulse irradiation time below one picosecond ($1 \times 10^{-12}$ m/s). For example, when a laser has photoenergy of 1 mJ and a pulse irradiation time below 100 femtosecond, energy density of the laser amounts to a level of 10 gigawatts enabling a processing of any materials.

If an ultra-short pulsed laser is irradiated an object to be processed, a multi-photon phenomenon occurs in a component lattice of the material in the object. Thus, an incident pulse is shorter than a time for a photon to transfer heat to the component lattice. While atomic excitation occurs by the multi-photon phenomenon, the problems including the processing precision reduction, the physical and chemical change of material, and the partial melting of the processed portion of the object can be solved to enable the processing execution of high precision.

The femtosecond laser processing barely produces byproducts, such as accumulated particles, craters and the like. Hence, a byproduct removing process, such as ultrasonic cleansing and the like, is not needed. Furthermore, the processing of a material having high thermal conductivity coefficient or low photo absorption rate is enabled, and it is able to process at least two species of materials and a composite material having multi-stacked layers by a single process.

Figure 3A:
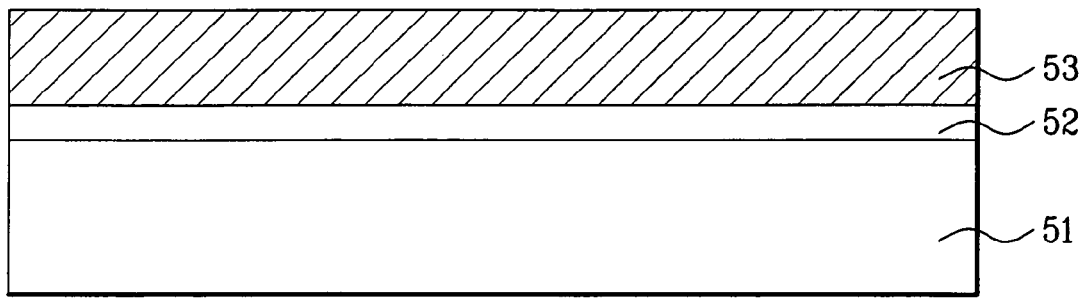
FIGS. 3A to 3C are cross-sectional views illustrating an exemplary thin film etching method according to an embodiment of the present invention.
Figure 3B:
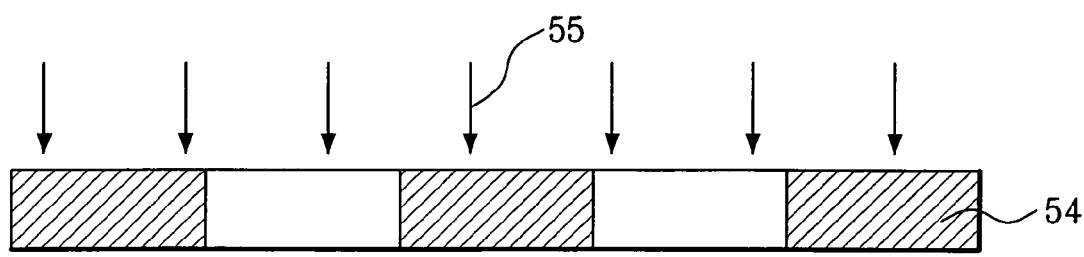
Figure 3B:
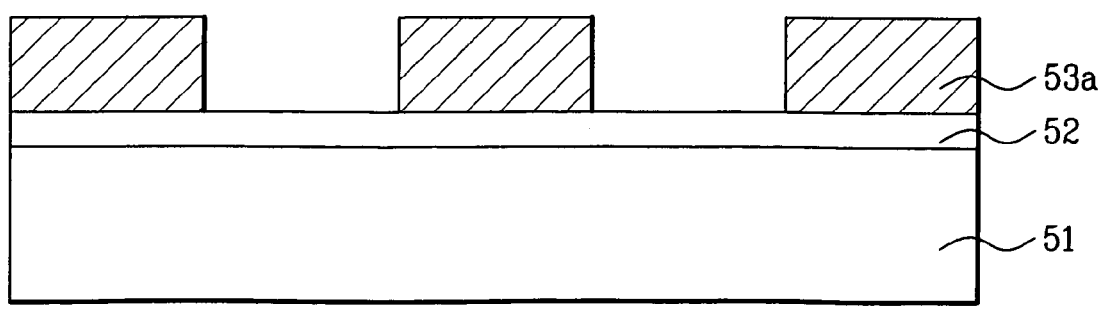
Figure 3C:
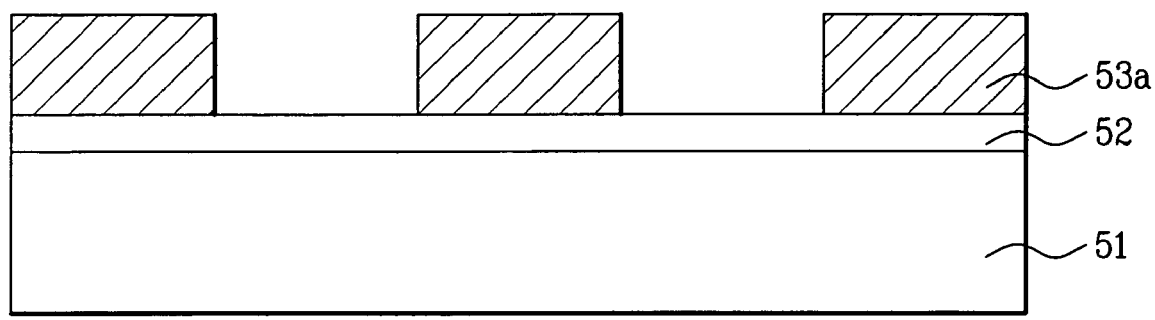

FIGS. 3A to 3C are cross-sectional views illustrating an exemplary thin film etching method according to an embodiment of the present invention. An object layer to be etched may include any type of material, such as an insulating layer, a metal layer, a semiconductor layer, a photosensitive resin and the like. FIGS. 3A to 3C illustrate a metal layer as an object layer in example. Referring to FIG. 3A, a buffer insulating layer 52 and a metal layer are sequentially formed on a substrate 51.

Referring to FIG. 3B, a mask 54 having a specific pattern defined thereon is placed over the metal layer 53. Irradiation 55 generated by a femtosecond laser is irradiated the metal layer 53 (shown in FIG. 3A) through the mask 54 to selectively remove a portion of the metal layer 53 (shown in FIG. 3A) and to form a metal line 53a. The femtosecond laser may have a short pulse width of about 150 fs and a high peak output per pulse. The irradiation 55 generated by the femtosecond laser generates no heat expansion and shockwave in the vicinity of a cut portion in etching the metal layer 53, thereby etching the metal layer 53 uniformly. The mask 54 may be formed of a material that is not transformed by the femtosecond laser irradiation 55. For example, the mask 54 may include silicon carbon (SiC). Thus, as shown in FIG. 3C, after the mask 54 is removed from the substrate 51, the metal line 53a having the pattern shape corresponding to the specific pattern of the mask 54 is formed.

In an embodiment of the present invention, a portion of an object layer is selectively removed by using a femtosecond laser, such that no heat expansion and shockwave occurs in the vicinity of the resultant pattern and an etched face is uniformly etched. The femtosecond laser has a peak power, which is amplified via a condensing lens, considerably higher than that of other lasers, and the peak power of the femtosecond laser has a range of about terawatts ($10^{12}$) to petawatts ($10^{15}$).

The femtosecond laser may be a table top terawatt laser (T3) laser. If light is condensed by a lens, light density can be raised considerably high to change an object in the vicinity of a focus into a plasma phase of high temperature instantly. Thus, in the femtosecond laser, per pulse energy is normally set to microjoule ($\mu J$), and in the case of strong power, the per pulse energy is set to milijoule (mJ). One watt is preferably used for average output.

Although plasma generated from a general laser reacts with the laser to absorb the laser or to heat a substance, such that thermal influence expansion, processing instability, and efficiency reduction occurs, the femtosecond laser does not have such reactions. In general, an acceptor accepting laser energy from a substance is an electron. In the case of metal and the like, the acceptor is a free electron at a conduction band or an excited electron excited to the conduction band by light. The electron (electron system) accepts the energy by a vibrating electric field of the laser. The energized electron collides with atom or ion within the lattice, gives its kinetic energy (to raise temperature) to change a state of the substance (dissolving or evaporation). Thus, the processing is performed.

Since it takes a femtosecond for the energy to be transferred to the lattice system from the electron system, the laser energy, absorption and the substance change processing thereafter are separated from each other on a time base. For instance, since a time scale that atom constructing an irradiated substance is ionized to generate plasma is longer than a pulse width, it is expected that the plasma will not react with the laser mutually. Since the pulse width is shorter than a time that heat spreads from an irradiated portion to neighbors, the laser energy locally exists within the irradiated portion or zone to trigger the phase chance of the substance within the corresponding zone only. Thus, for example, in the case of etching a metal layer using a femtosecond laser, no heat affected zone occurs in the vicinity of the etched portion.

Figure 4A:
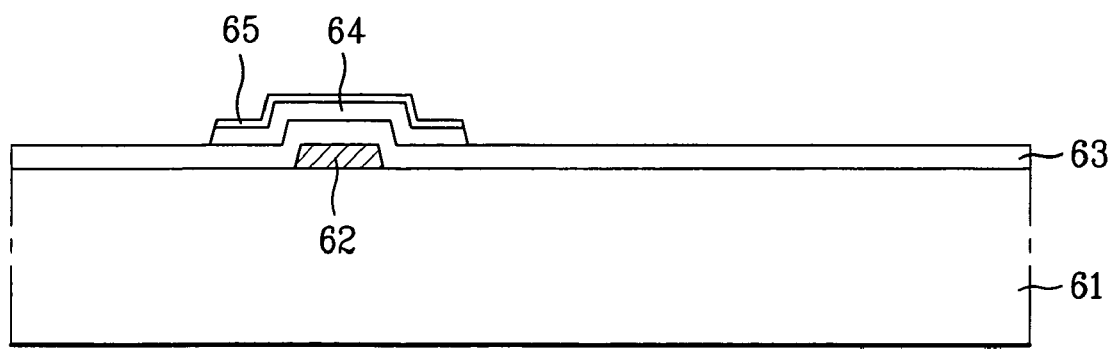
FIGS. 4A to 4F are cross-sectional views illustrating an exemplary method of fabricating a liquid crystal display device according to an embodiment of the present invention.

FIGS. 4A to 4F are cross-sectional views illustrating an exemplary method of fabricating a liquid crystal display device according to an embodiment of the present invention. Referring to FIG. 4A, a metal layer is formed on a transparent first substrate 61. A first mask (not shown) having a pattern defined thereon is aligned over the metal layer. The metal layer may be formed by depositing Al, Cu, W, Cr, Mo, Ti, Ta or Mo alloy, such as MoW, MoTa, MoNb, by CVD or sputtering. Subsequently, a femtosecond laser (not shown) irradiates the substrate 61 through the first mask to selectively remove a portion of the metal layer and to form a gate electrode 62. The gate electrode 62 may extend from a gate line, which is simultaneously formed in a first direction.

Subsequently, an insulating material, such as silicon nitride or silicon oxide, is deposited on the first substrate 61 including the gate electrode 62 to form a gate insulating layer 63. An amorphous silicon layer and a doped amorphous silicon layer are sequentially formed on the gate insulating layer 63. A second mask (not shown) having a pattern defined thereon is then aligned over the substrate 61. Subsequently, the femtosecond laser (not shown) irradiates the substrate 61 through the second mask to selectively remove a portion of the amorphous silicon layer and the doped amorphous silicon layer to form an active layer 64 and an ohmic contact layer 65.

Figure 4B:
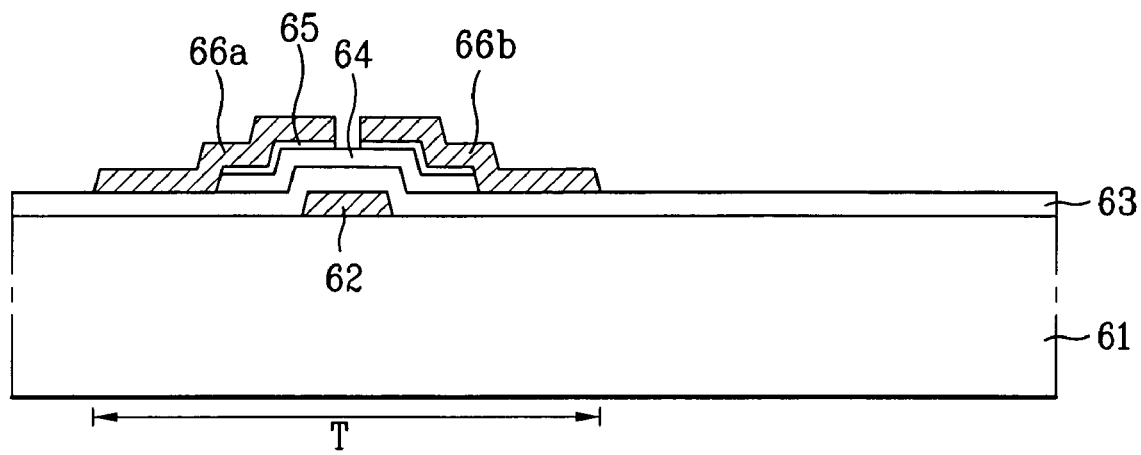

Referring to FIG. 4B, a second metal layer is formed on the first substrate 61. A third mask (not shown) having a pattern defined thereon is aligned over the substrate 61 having the second metal layer. Subsequently, the femtosecond laser (not shown) irradiates the substrate 61 through the third mask to selectively remove a portion of the second metal layer to form a source electrode 66a and a drain electrode 66b at lateral ends on the active layer 64. The source electrode 66a may extend from a data line, which is simultaneously formed in a second direction crossing the gate line, to thereby define a pixel area. In particular, the source and rain electrodes 66a and 66b are spaced apart from each other to form a channel in a later process. Thus, a portion of the ohmic contact layer 65 is exposed between the source and drain electrodes 66a and 66b. The source and drain electrodes 66a and 66b together with the gate electrode 62 form a thin film transistor T.

Figure 4C:
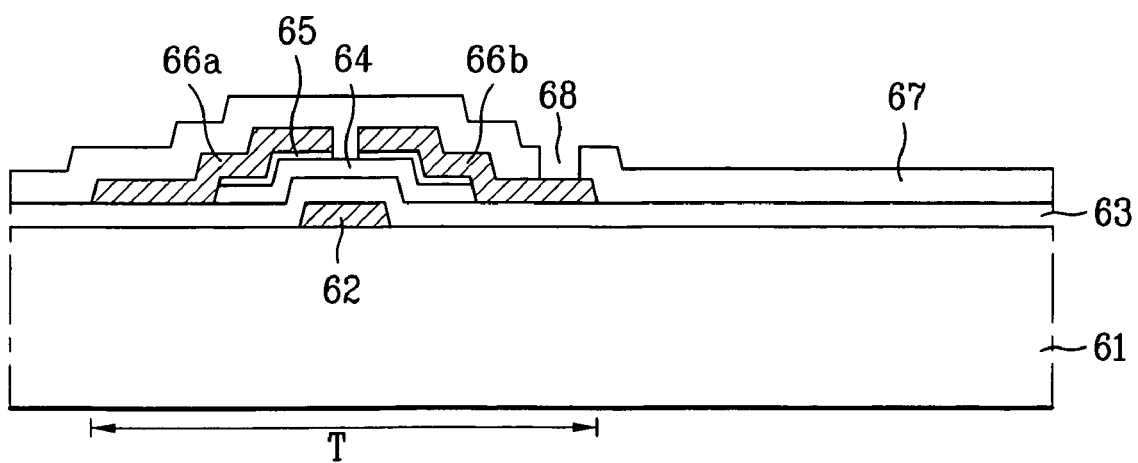

Referring to FIG. 4C, a silicon oxide, silicon nitride or organic insulating layer is formed on the source and drain electrodes 66a and 66b to form a protecting layer 67. When forming the protecting layer 17 with the organic insulating layer, a step difference generated from the thin film transistor T is preferably removed prior to subsequent processes.

A fourth mask (not shown) having a pattern defined thereon is aligned over the substrate 61 having the protecting layer 67. Subsequently, the femtosecond laser (not shown) irradiates the substrate 61 through the fourth mask to selectively remove a portion of the protecting layer 67 to form a contact hole 68 exposing a predetermined surface of the drain electrode 66b.

Figure 4D:
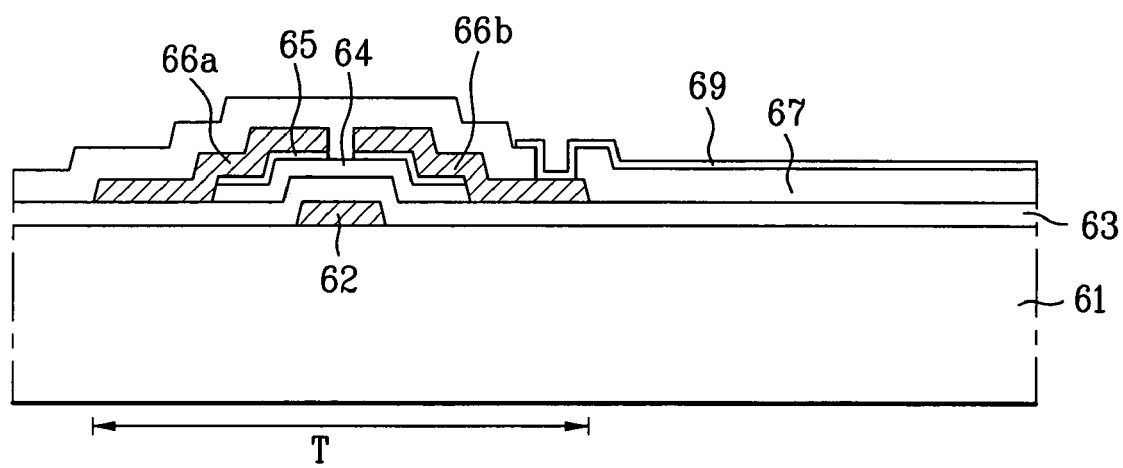

Referring to FIG. 4D, a transparent metal layer, such as an indium tin oxide (ITO) layer and an indium zinc oxide (IZO) layer is deposited over the first substrate 61 including the contact hole 68. A fifth mask (not shown) having a predetermined pattern defined thereon is aligned over the substrate 61 having the transparent metal layer. Subsequently, the femtosecond laser (not shown) irradiates the substrate 61 through the fifth mask to selectively pattern the transparent metal layer and to form a pixel electrode 69 electrically connected to the drain electrode 66b via the contact hole 68.

Figure 4E:
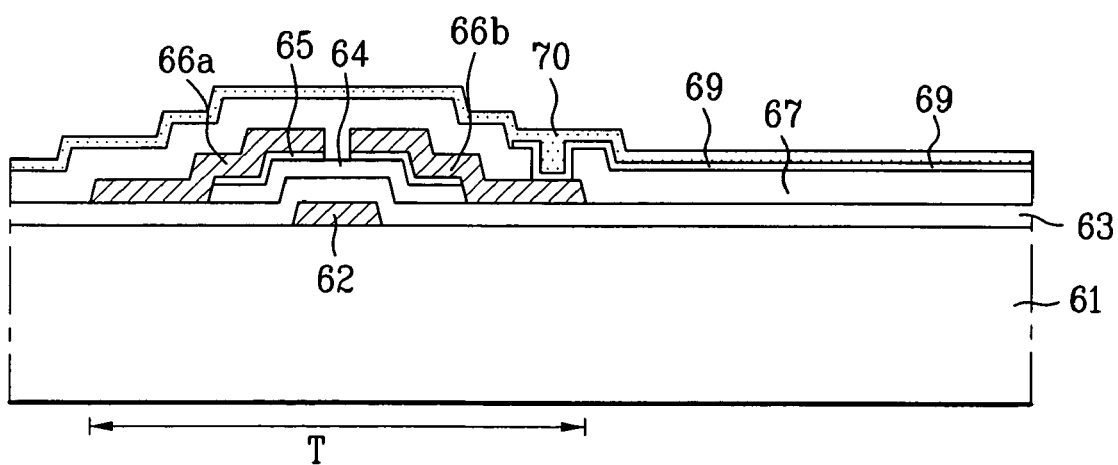

Referring to FIG. 4E, a first alignment layer 70 is formed over the first substrate 61 including the pixel electrode 69. The first alignment layer 70 may be formed by coating a polymer film having a polyimide-based organic material and aligning the polymer film by a rubbing process. The rubbing process, which includes the step of rubbing the first alignment layer 70 in a predetermined direction using a rubbing cloth, is suitable for mass production and provides a stable pretilt angle alignment. Alternatively, a photo alignment method using a polarized light may be used in forming the first alignment layer 70.

Figure 4F:
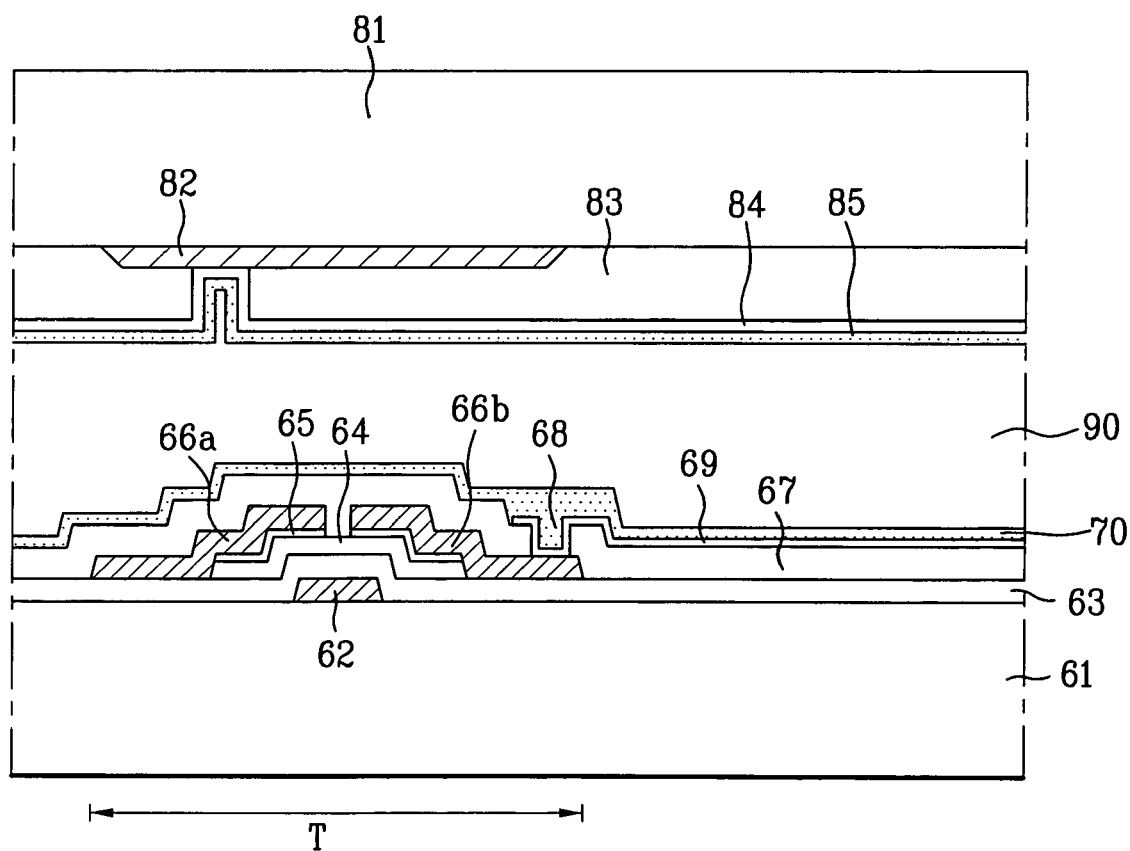

Referring to FIG. 4F, a second substrate 81 facing the first substrate 61. The second substrate 81 includes a black matrix 82. The black matrix 82 may be formed by depositing a light-blocking material, such as Cr, on the second substrate 81. A sixth mask (not shown) having a predetermined pattern defined thereon is aligned over the second substrate 81 having the light-blocking material. Subsequently, the femtosecond laser (not shown) irradiates the second substrate 81 through the sixth mask to selectively remove a portion of the light-blocking material to form the black matrix 82. In particular, the black matrix 82 corresponds to areas over the thin film transistor T, the gate line and the data line to prevent light leakage.

A color filter 83 is formed on the second substrate 81 between gaps of the black matrix 82. The color filter 83 may include red, green and blue sub-color filters, with each of the sub-colors corresponding to one pixel area. The color filter 83 may be formed by depositing a photosensitive film on the second substrate 81. For example, a red photosensitive film, a green photosensitive film and a blue photosensitive film may be sequentially formed on the second substrate 81. Then, portions of the red, green and blue photosensitive films are selectively removed using seventh-ninth masks and using the femtosecond laser.

A common electrode 84 is formed on the second substrate 81 including the color filter 83. The common electrode 84 may be formed by depositing a transparent metal material on the second substrate 81 including the color filter 83. A portion of the transparent metal material is then selectively removed using a tenth mask and using the femtosecond laser. Further, a second alignment layer 85 is formed of a material, such as polyimide and the like, on the common electrode 84 such that a surface of the second alignment layer 85 is oriented in a predetermined direction.

A seal pattern (not shown) is formed on one of the first substrate 61 and the second substrate 81. The seal pattern is formed at a periphery of an image area of a liquid crystal display panel, and the seal pattern may be formed by forming a thermo-hardening resin to have a uniform pattern using the femtosecond laser.

To maintain the uniform gap between the first and second substrates 61 and 81, spacers (not shown) may be scattered on one the first substrate 61 and the second substrate 81. The spacers are scattered by wet scattering of a mixture of spacers and alcohol and the like or dry scattering of spacers only. Dry scattering is divided into electrostatic scattering using static electricity and non-electric scattering using a gas pressure. Since the liquid crystal display device is vulnerable to static electricity, non-electric scattering is widely used.

Subsequently, the first and second substrates 61 and 81 are loaded in a bonding chamber and are bonded to each other by pressurizing and hardening the seal pattern. As a result, the first substrate 61 and the second substrate 81 are arranged with the first and second alignment layers 70 and 85 facing each other and the pixel electrode 69 facing the color filter 83 in one-to-one manner.

After the first and second substrates 61 and 81 are bonded to each other, a liquid crystal material is injected between the bonded first and second substrates 61 and 81 via a gap in the seal pattern to form a liquid crystal layer 90. The liquid crystal injection may be carried out by vacuum injection using a difference between inner and outer pressures of the LCD panel. When the liquid crystal molecules are injected in the LCD panel, air amongst the liquid crystal molecules creates bubbles within the LCD panel that cause device failure. To prevent the bubble generation, a process of removing the bubbles by leaving the liquid crystal molecules in a vacuum state for a considerable time is needed. After completion of the liquid crystal injection, the gap in the seal pattern is sealed to prevent the liquid crystal material from flowing out via the gap.

Alternatively, prior to bonding the first and second substrates 61 and 81, the liquid crystal layer 90 may be formed using a liquid crystal dropping method. For example, a liquid crystal material may be dropped onto one of the first and second substrates 61 and 81. Then, as the first and second substrates 61 and 81 are bonded to each other, the dropped liquid crystal material may be spread outwardly and be evenly distributed across the resultant liquid crystal display panel by a substrate bonding pressure. Since the liquid crystal dropping method quickly drops liquid crystals on one of the substrates, it is able to quickly form a liquid crystal layer of a wide-area liquid crystal display device. In addition, a required quantity of liquid crystals is directly dropped onto the substrate to minimize liquid crystal waste, thereby considerably lowering a fabricating cost.

Hence, in an embodiment of the present invention, instead of etching a photoresist film by the coating, exposure, development and removal processes, an object film is etched by irradiating with a femtosecond laser having a short pulse width and high peak output per pulse through a mask. Thus, the fabrication process is simplified and productivity is increased.

It will be apparent to those skilled in the art that various modifications and variations can be made in the thin film etching method and the method of fabricating a liquid crystal display device using the same of the present invention without departing from the spirit or scope of the invention. Thus, it is intended that the present invention covers the modifications and variations of this invention provided they come within the scope of the appended claims and their equivalents.

What is claimed is:

1. A method of fabricating a liquid crystal display device, comprising:
   forming a first conductive layer on a first substrate;
   removing a portion of the first conductive layer using a femtosecond laser to form a gate electrode;
   forming a gate insulating layer on the first substrate including the gate electrode;

forming a semiconductor layer on the first substrate including the gate insulating layer;
removing a portion of the semiconductor layer using the femtosecond laser to form an active layer;
forming a second conductive layer on the first substrate including the active layer;
removing a portion of the second conductive layer using the femtosecond laser to form a source electrode and a drain electrode;
forming a protecting layer on the first substrate including the source and drain electrodes;
removing a portion of the protecting layer to form a contact hole exposing a portion of the source electrode using the femtosecond laser;
forming a third conductive layer on the first substrate including the contact hole; and
removing a portion of the third conductive layer using the femtosecond laser to form a pixel electrode electrically connected to the drain electrode via the contact hole;
forming a non-transparent layer on a second substrate;
removing a portion of the non-transparent layer using the femtosecond laser to form a black matrix;
sequentially forming red, green and blue photosensitive films on the corresponded region of the second substrate including the black matrix and then together removing portions of the red, green and blue photosensitive films using the femtosecond laser to form red, green, blue color filters;
forming a fourth conductive layer on the second substrate including the color filter; and
removing a portion of the fourth conductive layer using the femtosecond laser to a common electrode.

2. The method of claim 1, further comprising:
forming a first alignment layer on the first substrate including the pixel electrode.

3. The method of claim 1, further comprising:
forming a second alignment layer on the second substrate including the common electrode.

4. The method of claim 1, further comprising:
bonding the first and second substrates to each other; and
forming a liquid crystal layer between a predetermined space between the first and second substrates.

5. The method of claim 4, wherein the liquid crystal layer is formed before the first and second substrates are bonded to each other.

6. The method of claim 4, wherein the liquid crystal layer is formed after the first and second substrates are bonded to each other.

7. The method of claim 4, further comprising:
forming a seal pattern at a periphery of one of the first and second substrates before the first and second substrates are bonded to each other.

8. The method of claim 7, wherein the seal pattern includes a thermo-hardening resin or a photo-hardening resin.

9. The method of claim 1, wherein the forming the third conductive layer includes depositing a transparent metal material on the first substrate.

* * * * *